United States Patent [19]

Tanaka et al.

[11] Patent Number: 5,095,359
[45] Date of Patent: Mar. 10, 1992

[54] SEMICONDUCTOR PACKAGE AND COMPUTER USING THE PACKAGE

[75] Inventors: Akira Tanaka, Katsuta; Hirokazu Inoue, Ibaraki; Kazuji Yamada; Kunio Miyazaki; Osamu Miura; Hideo Arakawa; Hiroshi Yokoyama; Yoshio Naganuma, all of Hitachi; Atsushi Morihara, Katsuta; Katsunori Ouchi, Hitachi, all of Japan

[73] Assignee: Hitachi, Ltd., Tokyo, Japan

[21] Appl. No.: 413,622

[22] Filed: Sep. 28, 1989

[30] Foreign Application Priority Data

Sep. 30, 1988 [JP] Japan ................. 63-244140

[51] Int. Cl.⁵ .............................. H01L 23/02
[52] U.S. Cl. .............................. 357/74; 357/81
[58] Field of Search ........................ 387/74, 81

[56] References Cited

U.S. PATENT DOCUMENTS

| 4,744,007 | 5/1988 | Watari | 357/81 |
| 4,894,708 | 1/1990 | Watari | 357/74 |

FOREIGN PATENT DOCUMENTS 62-169461 7/1987 Japan ................. 357/74
62-249429 10/1987 Japan ................. 357/74

OTHER PUBLICATIONS

"Components and Packing for the FACOM M-780" Fujitsu 37.2 pp. 116-123.

Primary Examiner—Eugene R. LaRoche
Assistant Examiner—R. Ratliff
Attorney, Agent, or Firm—Antonelli, Terry Stout & Kraus

[57] ABSTRACT

A semiconductor package for use in computers includes a insulating substrate onto which a semiconductor device is mounted, an insulating cap which shuts out outside air and seals said semiconductor device, power-source lines which provide power to the semiconductor device, and signal lines which transmit output signals from the semiconductor device to external circuits. The signal lines are arranged perpendicularly to the insulating substrate so that they are prevented from the dielectric constant of the insulating substrate, while the power-source lines are formed within the insulating substrate and connected through conductive layers parallel to the surface onto which the semiconductor is mounted to external leads.

13 Claims, 10 Drawing Sheets

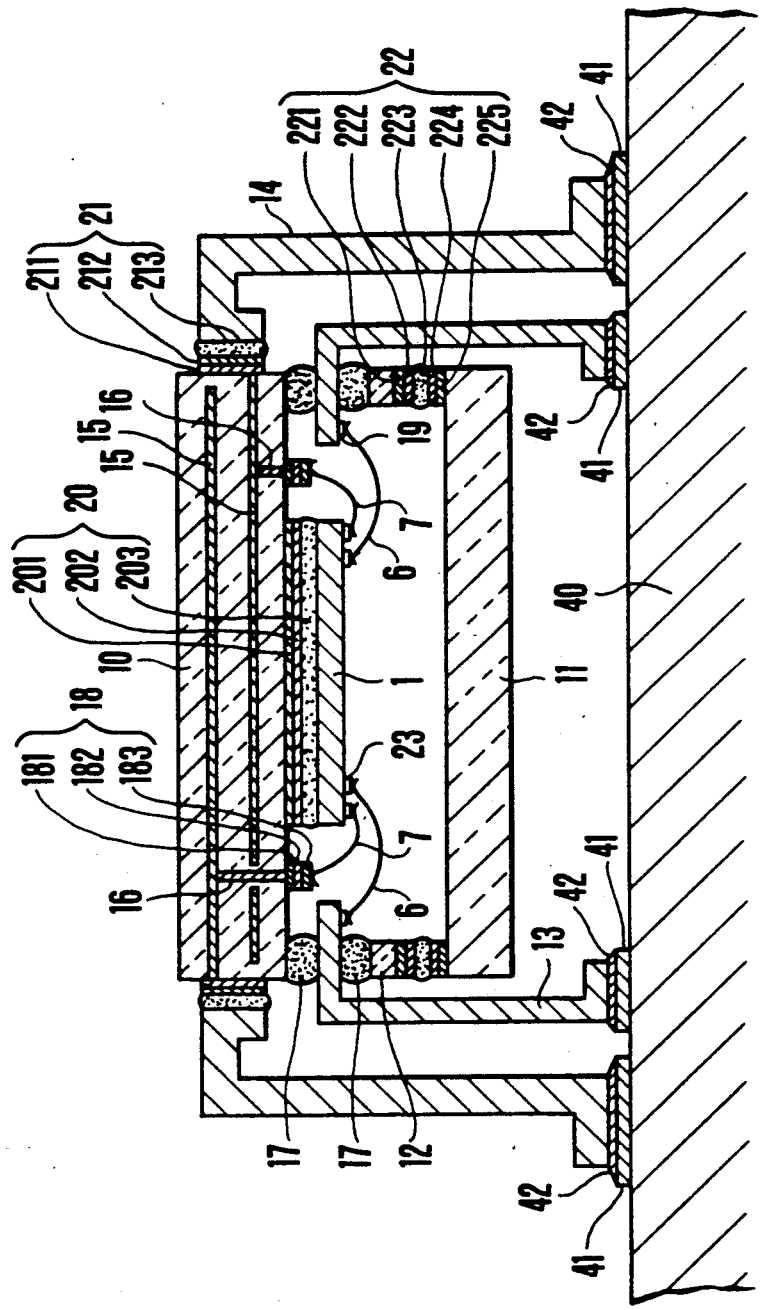

COOLING AIR

SEMICONDUCTOR PACKAGE AND COMPUTER USING THE PACKAGE

BACKGROUND OF THE INVENTION

1. Field of the Invention

This invention relates to a novel semiconductor package and a computer which uses it.

2. Prior Art Statement

Recent demands for faster and more compact computers based on semiconductor devices have spurred higher degrees of integration and larger semiconductor devices. They have also led to an increase in the number of terminal electrodes used for connecting semiconductor devices to the outside. In order to deal with ever greater numbers of terminals, the method of controlled collapse bonding (CCB) in which many electrodes are regularly arranged on one main surface of the semiconductor device has been used in packages of a structure in which electrodes on the semiconductor device are electrically connected to electrodes on a package substrate used for mounting the semiconductor device. Radiation of heat from such package substrates to which semiconductor devices are mounted by means of the CCB method is covered, as in Japanese Laid-Open Patent Publication (JP-A) 62-249429, by connecting a surface of the package on which electrodes of the semiconductor device are not formed to a cap substrate with solder or other thermally conductive material, but no attention is paid to wiring within the base substrate. Multi-layer base substrates normally include a conductive layer for signal transmission, a conductive layer for power supply, a conductive layer for connection to ground and conductive layers for many other systems. With such conventional package structures, the conductive layer for power supply within the substrate, like the conductive layer for signal transmission and conductive layer for connection to ground, is wired with fine lines of nearly uniform cross-sectional shape, each connected to terminals for connecting to the outside. In addition, for computers which are normally required to perform high-speed operations, in order to suppress voltage fluctuations due to instantaneous current during signal switching, capacitor devices have been built into the printed substrate onto which the package is mounted, or the package has been connected to a nearby capacitor device, or as seen in Japanese Laid-Open Patent Publication (JP-A) No. 62-169461, a structure in which capacitor devices are formed on part of the package has been employed.

Furthermore, with respect to higher densities and higher degrees of integration, the presently main-stream DIP package is being replaced by packages with structures suited to connection of many terminals, such as flat packages in which the terminals for connecting to the outside are arranged along the four edges of the package substrate, and PGA-type packages in which terminals for connecting to the outside are arranged on a single face of the package substrate.

An example of flat packages is a 200-pin class package disclosed in "Components and Packaging for the FACOM M-780" FUJITSU 37.2. pp. 116-123.

On the other hand, while high speed has not posed any particular problem up until now, conventional packages are becoming unable to satisfy performance requirements. Current flowing through a package can be broadly divided into two types, each requiring different properties. The first is signal current which is required to have as short of rise and fall times as possible. This requirement, expressed as conditions for the transmission circuits, means that inductance and capacitance are to be reduced to as low of level as possible. The other type of current flowing through the package is the power-source current. Fluctuations in the power-source voltage due to load fluctuations are required to be kept as low as possible. To achieve this end, inductance in the transmission circuit for the power-source current should be reduced but capacitance should be increased. Conventional packages cannot assure sufficient capacitance, so the function of stabilizing voltage was not required of the package so only reduction of inductance is aimed for. As a means of realizing this, the transmission path for the power-source current is made shorter than that of the signal current, specifically by bringing the power-source pin close to the semiconductor device (or near the center of the four edges). Yet this method, while reducing the inductance of the power-source line, also reduces the capacitance at the same time. Moreover, this involves the problem of a proportionate increase in the inductance and capacitance of the signal lines.

No conventional packages have structures which allow the different requirements of the power-source lines and signal lines to be satisfied simultaneously.

When a capacitor device is externally attached near the package, the length of wiring from the semiconductor device to the capacitor, so the power-source voltage fluctuations cannot be sufficiently suppressed. Since the wiring lines in the conductive layers for power supply and connection to ground are thin, they are susceptible to fluctuations in power-source voltage from the outside, becoming one cause of malfunctions. Furthermore, the conductive layer for signal transmission extends into the periphery within the package substrate, and the terminals are positioned among the terminals of conductive layers for power supply and connection to ground. For this reason, the length of wiring which passes through a ceramic substrate of a high dielectric constant is long so the signal transmission lag time becomes large. Also, in a structure as seen in Japanese Laid-Open Patent Publication (JP-A) No. 62-169461, in which a capacitor device is formed in part of the package, since a capacitor is formed on the side on which the heat generated by the semiconductor device is dissipated, effective thermal resistance within the package increases so that heat radiation would be insufficient if mounted with one of the semiconductor devices which have in recent years become larger, more highly integrated and generate more heat.

SUMMARY OF THE INVENTION

The object of the invention is to provide a reliable package for semiconductor devices with the property of high-speed signal transmission.

The present invention is a semiconductor package characterized by, in a semiconductor package which has an electrically insulating substrate to which a semiconductor device is mounted and an electrically insulating cap which shuts out outside air and seals the semiconductor device, and is provided with power-source lines which provide a power source for the semiconductor device and signal lines which transmit signals from the semiconductor device, an improvement by which the signal lines are arranged such that they are not affected by a dielectric constant of the substrate.

Furthermore, in the present invention, the power-source lines are formed in the electrically insulating substrate by conductive layers parallel to the semiconductor device mounting surface, while the signal lines do not have a parallel conductive layer within the electrically insulating substrate, or alternately, the power-source line is connected to external leads by an internal path through the electrically insulating substrate, while the signal lines are connected to external leads by internal paths through either the electrically insulating substrate or an electrically insulating cap.

In addition, the conductive layer within the electrically insulating substrate and the semiconductor device are electrically connected by fine metal lines on the semiconductor device mounting surface of the electrically insulating substrate, and the conductive layer and semiconductor package external leads are electrically connected on a lateral face of the electrically insulating substrate, while the signal lines are embodied as fine metal lines connecting the semiconductor device to the external leads. The fine metal lines are made of Au, Ag, Al or Cu or an alloy comprised mainly of these elements. The lines measure approximately 20 to 60 $\mu m$ in diameter.

The electrically insulating substrate and cap are formed as ceramic sintered bodies, and in particular, these parts would preferably have coefficients of thermal expansion which approximate that of silicon, room temperature thermal conductivities of 100 W/m·K or greater, and dielectric constants of 8.8 or greater. It is also preferable that the coefficients of thermal expansion of the substrate and cap approximate each other. These parts are made of silicon carbide, aluminum nitride, mullite or other sintered bodies. Polyimide glass and epoxy glass are also possible.

In addition, a combination of: sealing out the outside air by bonding the electrically insulating substrate and electrically insulating cap with glass; using a plurality of metal pins as the terminals for connecting the semiconductor package to the outside; arranging the tips of these metal pins on the electrically insulating cap side of the semiconductor package; arranging the metal pins on the periphery of the semiconductor package and dividing the power-source lines and signal lines into separate rows; electrically connecting the tips of the signal line external lead metal pins, which are connected to an electrical connection path which passes through neither the electrically insulating substrate nor the electrically insulating cap, to the printed substrate by placing them in contact with and soldering them to the surface of a conductive pad on the printed substrate; electrically connecting the tips of the power-source line external lead metal pins, which are connected to an electrical connection path which passes through the conductive layer within the material of the electrically insulating substrate, to the printed substrate by either placing them in contact with and soldering them to the surface of a conductive pad on the printed substrate, or inserting them into through holes formed on the printed substrate; and making the power-source line metal pins thick and spaced widely apart, serving to mechanically support the semiconductor package.

The present invention lies in a electrically insulating substrate characterized by, in a electrically insulating substrate having a plurality of conductive layers each insulated from each other by the interior of a semiconductor device mounting which forms a semiconductor package comprising an electrically insulating cap forming an airtight vessel, the improvements of extending the spread of the conductive layer and having linear conducting paths which electrically connect to any single conductive layer without touching other conductive layers, yet cross the conductive layer without penetrating the conductive layer.

The substrate has a room temperature thermal conductivity of 100 W/m·K or greater, is made of ceramic with a coefficient of thermal expansion approximates that of silicon, is formed as the conductive layers are sintered simultaneously with the ceramic. The substrate is preferably a sintered body of silicon carbide, aluminum nitride, mullite or the like.

The invention is a semiconductor device for a semiconductor package provided with an electrically insulating substrate, an electrically insulating cap which shuts out outside air and seals the package interior, and metal pins which connect to external wiring means connected to electrical connection circuits for two systems of signal lines, without passing through either the electrically insulating substrate or the electrically insulating cap, in which bonding pads for the power-source lines and signal lines are arranged around the periphery of the semiconductor device in at least two rows, and in which the bonding pads for the power source are provided on the outermost periphery.

The semiconductor packages of the invention described above can be used in a computer which is provided with platters, multi-layer printed substrates connected to the platters by connectors, logical semiconductor packages and main-memory semiconductor packages mounted on the substrates.

Furthermore, in a semiconductor package as described above, the invention also includes, in order to make any effects of a dielectric constant of the substrate as small as possible, the signal line being wired perpendicularly within the substrate, and the power-source line passing through a conductive layer formed within the substrate parallel to the surface on which the semiconductor device is mounted, and connects to external leads.

In addition, the conductive layers are longer than the thickness of the substrate and have sufficient length that malfunctions accompanying external voltage fluctuations do not occur, the signal lines are formed of conductive paths within the substrates and are of a length equal to the thickness of the substrate, and the external terminals for the power-supply lines and signal lines are formed on the back side of the substrate on the opposite side from the surface on which the semiconductor device is mounted.

In particular, it is preferable that the terminals for the power-source lines formed on the substrate are arranged outside of the terminals for the signal lines.

Electrodes for the power source of the semiconductor device connected to external connection terminals formed on the substrate by solder bumps, or for connecting to ground should be arranged in a plurality of rows, alternating with electrodes for signal lines.

The surface opposite the surface on which the electrodes for the semiconductor device are provided should be connected to an electrically insulating cap by a material with high thermal conductivity.

A thin-film multi-layer wiring layer should be formed on the surface on which the semiconductor device is mounted, and it is particularly preferable that this wiring layer be formed by a resin layer.

In the invention, in a semiconductor package described above, in order to minimize any effects of a dielectric constant of the substrate, the signal line is wired perpendicularly within the substrate, the power-source line passes through a conductive layer formed within the substrate parallel to the surface on which the semiconductor device is mounted, and connects to external leads, and the signal line and power-source line are connected to the electrodes for the semiconductor device with fine metal lines.

In a semiconductor package to which a semiconductor device is mounted, at least two systems of electrical paths leading from inside the package to outside the package. At least one of these is the power-supply system which passes through the electrically insulating substrate onto which the semiconductor package is mounted. Moreover, the direction of wiring within the electrically insulating substrate includes components parallel to the electrically insulating substrate. At the same time, the other system is the signal system for the semiconductor device. By minimizing the effect of the dielectric constant of the substrate in the electrically insulating substrate, particularly by eliminating all components of the signal system parallel to the electrically insulating substrate, even when a ceramic or other material with a large dielectric constant is used for the substrate, the propagation lag time can be minimized by minimizing the signal propagation path.

In other words, a propagation path should be provided such that the inductance and capacitance of the signal current are be reduced so that the dielectric constant of the substrate has no effect. At the same time, a propagation path for the power-supply current such that the inductance is reduced but the capacitance is increased to gain maximum use of the effect of the dielectric constant of the substrate. This will result in a reduction in signal transmission lag times and a marked decrease in malfunctions due to voltage fluctuations.

By using for the electrically insulating substrate a material with a dielectric constant at 1 MHz of 8.8 or greater, the above effect is particularly large. It is also preferable that the dielectric loss at 1 MHz is greater than $5 \times 10^{-4}$.

As described above, as a result of creating one conduction path with both low inductance and low capacitance and one conduction path with low inductance but high capacitance, the following effects are obtained. Since the signal line is arranged so that it is not affected by inductance and capacitance, the signal lag time can be minimized. Since the inductance is small yet the signal line is arranged with respect to the substrate so that the effect of capacitance is prevented, fluctuations in power-source voltage due to signal switching are minimized. In addition, as to the synergistic effect, even when a plurality of operation blocks are run simultaneously, fluctuations in power-source voltage can be minimized, so the overall operating speed can possibly be increased through parallel execution.

BRIEF DESCRIPTION OF THE DRAWINGS

FIG. 2 is a cross-section of a semiconductor package which illustrates Preferred Embodiment 2 of the invention.

DESCRIPTION OF THE PREFERRED EMBODIMENTS

Embodiment 1

Figure 1:
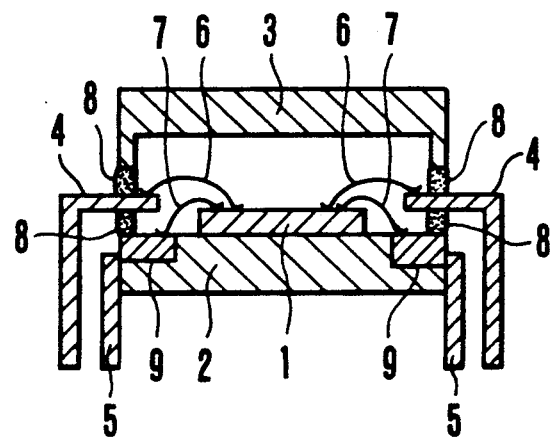
FIG. 1 is a cross-section of a semiconductor package which illustrates Preferred Embodiment 1 of the invention.

FIG. 1 is a cross-section of a semiconductor package which illustrates Preferred Embodiment 1 of the invention, in which 1 is a semiconductor device, 2 is an electrically insulating substrate, 3 is an electrically insulating cap, 4 is a signal line metal pin, 5 is a power-source line metal pin, 6 is a signal line wire, 7 is a power-source line wire, 8 is insulating material used for sealing, and 9 is a conducting path. In the Figure, a flat pack-type package is illustrated as an example. The signal current is transmitted from the semiconductor device 1 through signal line wire 6 to the signal line metal pin 4 and leaves the package. A large part of the self-inductance of this path is determined by the length and cross-sectional area of the signal line wire 6 and the signal line metal pin 4. Thus the dimensions and shape of the wiring path are dominant. In contrast, while the dimensions and shape of the wire itself are also major factors affecting capacitance, they also vary greatly depending on the distance to a counter electrode (e.g., power-source wiring) and the dielectric constant of insulators along the way. In the case in the Figure, the wiring path is nearly completely surrounded by air, with only one part surrounded by insulating material used for sealing 8, so the capacitance is small.

Next the path of power-source current will be described. The power-source current is led from semiconductor device 1 through power-source line wire 7 along the conducting path 9 and enters the interior of electrically insulating substrate 2. Next it is transmitted to power-source line metal pin 5 on the edge of electrically insulating substrate 2, and leaves the package. The self-inductance of this path is determined by the length and cross-sectional area of the power supply line wire 7, conducting path 9 and power supply metal pin 4. Thus as in the case of the signal current, the dimensions and shape of the wiring path are the determining factors. In contrast, the conducting path 9 is surrounded by dielectrics and also, two paths of different electric potential pass near to each other in opposite directions, so the capacitance is large.

As described above, transmission paths for the signal current are provided such that they are affected to the least possible degree by the inductance and capacitance, while transmission paths for the power-source current are provided such that the inductance is reduced while the capacitance is increased.

In this Preferred Embodiment, the portion of the signal line in contact with the ceramic substrate is extremely small, so the signal transmission lag time is reduced by 30%.

Embodiment 2

Figure 3:
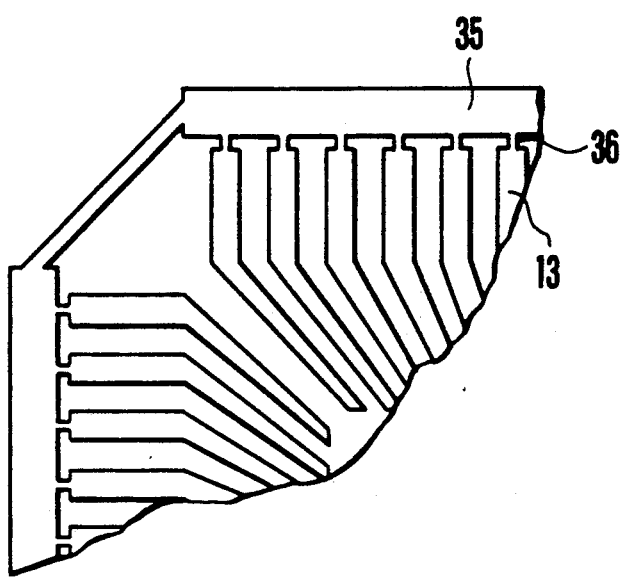
FIG. 3 is a top view of the metal pins of the semiconductor package of FIG. 2.

A second embodiment of the invention will be described in reference to FIGS. 2, 3, and 7. A semiconductor device 1 measuring 15 mm square is positioned near the center of an AlN substrate 10 (an electrically insulating substrate made from an aluminum nitride sintered body) and its rear surface is fixed by a die-bonding section 20. Here in contrast to FIG. 1 described above, the AlN substrate 10 is positioned in the top portion of the entire package. This arrangement, known as a cavity-below arrangement is beneficial in that heat radiation is improved. In contrast, the arrangement of FIG. 1 is known as a cavity-above arrangement and while heat radiation is not as good as the cavity-below arrangement, its ease of fabrication makes it a beneficial structure from a cost standpoint. The AlN substrate 10 measures 30 mm square and 1 mm thick. In the interior of AlN substrate 10 are two planar conductive layers 15 made of tungsten. The distance between the surfaces is approximately 0.1 mm. Two hundred power-source-line Kovar pins 14 (cross-sectional dimensions: 250 $\mu$m wide × 250 $\mu$m thick) are bonded onto the edge of the AlN substrate 10 by Kovar pin bonding sections 21. An AlN cap 11 measuring 30 mm square and 1 mm thick is positioned opposite the AlN substrate 10 and bonded to an AlN ring 12 with a sealing solder section 22. The AlN ring 12 is bonded with sealing glass 17 to 400 signal-line Kovar pins 13 (cross-sectional dimensions: 125 $\mu$m wide × 100 $\mu$m thick) and the AlN substrate 10.

The path of power-source current will now be described. First, the signal current passes from the semiconductor device 1 through a device-side bonding pad 23, through signal line wire 6 and is transmitted through a pin-side bonding pad 19 to the signal-line Kovar pins 13 and out of the package. The self-inductance of this path is determined by the length and cross-sectional area of the signal line wire 6 and signal-line Kovar pins 13, and upon measurement, was found to be 8 nH. Next, the capacitance was measured. As described previously, capacitance is greatly affected by the distance to a counter electrode (e.g., power-source wiring) and the dielectric constant of insulators along the way. In this structure, the wiring path is nearly completely surrounded by air, with only one part surrounded by sealing glass 17, so the capacitance is small, being 0.9 pF for the longest path. The power-source current passes from semiconductor device 1 through device-side bonding pads 23, through power-source line wires 7 and enters the AlN substrate 10 through substrate-side bonding pads 18. Inside the AlN substrate 10 is a tungsten conducting path sintered and formed simultaneously with the sintering of the AlN. The current first flows along linear conducting paths 16 connected to substrate-side bonding pads 18 and perpendicularly traverses the substrate. The linear conducting paths 16 are connected to either of two planar conductive layers 15. The ends of the planar conductive layers 15 are extended to ends of the AlN substrate 10, so the power-source current reaches the ends of the AlN substrate 10 along this path. In order to connect to the planar conductive layers 15, Kovar pin bonding sections 21 are formed on these ends and connected to power-source-line Kovar pins 14 so that the power-source current reaches the power-source-line Kovar pins 14. Now the self-inductance of this path will be described. Since the planar conductive layers 15 are formed within the AlN substrate 10, the increase in inductance when current flows through these layers is extremely small, so it can actually be ignored. And since the linear conducting paths 16 are connected perpendicularly to the planar conductive layers 15, there is also no increase in inductance due to the connection. As a result, the effective wiring length is shorter than the path of the signal current, so even the longest path has a self-inductance of 4 nH, an extremely low value. Furthermore, as described previously, capacitance is greatly dependent on the state of the wiring surroundings. This Preferred Embodiment uses AlN which has a relatively high dielectric constant of approximately 10, yet even so, because the planar conductive layers separated by a distance of 0.1 mm and are kept at the power-source voltage facing each other, a relatively high capacitance is obtained.

By selecting materials which have coefficients of thermal expansion near that of silicon for use here, reliability is increased. Specifically, since the coefficient of thermal expansion of silicon is approximately $2 \times 10^{-6}/°C.$, that of AlN is approximately $4 \times 10^{-6}/°C.$, that of Kovar (an alloy of iron containing 29% nickel and 17% cobalt by weight) is approximately $4.5 \times 10^{-6}/°C.$, that of glass (containing 15% zinc oxide, 55% boron oxide, 10% lead oxide, 16% silicon oxide by weight along with alumina and zinc fluoride) is approximately $5 \times 10^{-6}/°C.$, all values near that of silicon. The effect of differences in coefficients of thermal expansion is particularly marked in large parts, so the same material was selected for the AlN substrate 10 and AlN cap 11.

The most reliable glass available was used as the insulating material for sealing. As described later, due to difficulties in processing, the AlN cap 11 could not be formed as a single unit like the electrically insulating cap 3 of FIG. 1, becoming a compound structure with the AlN ring. The dielectric constant of AlN at 1 MHz is between 8.8 and 10.0, while that of the substrate of SiC containing Be is approximately 42.

The room-temperature dielectric loss at 1 MHz is between 5 and 20 for an AlN sintered body, while that of a Be-containing SiC sintered body is 500, and this is effective as the substrate of the invention.

Here follows an explanation of the manufacturing process of this Preferred Embodiment:

(1) Green sheets of AlN are stacked and sintered at between 1,800° C. and 1,900° C. to produce the AlN substrate 10. During green sheet manufacture, holes are punched crosswise to the thickness direction in the locations corresponding to wiring, specifically the linear conducting paths 16, and then the holes are filled with tungsten paste. In addition, each sheet is printed with tungsten paste according to the pattern of the planar conductive layers 15.

(2) Nickel is electroplated onto AlN substrate 10 edge tungsten patterns, specifically Kovar pin bonding section tungsten layers 211, and AlN substrate 10 surface tungsten patterns, specifically die-bonding section tungsten layers 201 and substrate-side bonding pad tungsten layers 181. The electroplating forms Kovar pin bonding section nickel layers 212, die-bonding section tungsten layers 202 and substrate-side bonding pad tungsten layers 182, respectively.

(3) The power-source-line Kovar pins 14 and signal line Kovar pins 13 are formed from a single sheet of Kovar plate by chemical etching. FIG. 3 shows the shape of the signal line Kovar pins 13 after etching. The ends of the signal line Kovar pins 13 are connected together with a frame 35 to improve the workability of later work.

(4) Silver solder [eutectic solder (silver containing 28% copper by weight)] is used to solder power-source-line Kovar pins 14 to the AlN substrate 10. The soldering is carried out in a nitrogen atmosphere at a maximum temperature of 830° C. This results in the completed Kovar pin bonding sections 21 shown in the diagram.

(5) An AlN ring 12 of peripheral dimensions 30 mm square, the same as AlN substrate 10, is fabricated by sintering, and one of its faces is coated with a paste whose main components are molybdenum and manganese. The ring is heat-treated at a maximum temperature of approximately 900° C. to form a sealing solder section molybdenum-manganese layer 221. Nickel is electroplated onto the surface of the molybdenum-manganese layer 221 to form a nickel layer 222.

(6) The AlN ring 12 completed as above, the signal-line Kovar pins 13 and the AlN substrate 10 are bonded together with sealing glass 17. In order to assure reliability, the glass was required to have a coefficient of thermal expansion near to those of other structural materials. The glass used (containing 15% zinc oxide, 55% boron oxide, 10% lead oxide, 16% silicon oxide by weight along with alumina and zinc fluoride) has a coefficient of thermal expansion of approximately $5 \times 10^{-6}/°C.$, near the coefficient of thermal expansion of silicon of approximately $2 \times 10^{-6}/°C.$, that of AlN of approximately $4 \times 10^{-6}/°C.$, and that of Kovar of approximately $4.5 \times 10^{-6}/°C.$ Furthermore, while normal glass must be bonded in an oxidizing atmosphere, the nickel on the surface of the AlN substrate 10 or the AlN ring 12 is easily oxidized and has properties which impair solderability, so the glass was selected to be specifically able to be bonded in a nitrogen atmosphere. Furthermore, the working temperature must be a temperature at which the already bonded solder would not be remelted. The above glass satisfies all of these requirements, so the bonding is carried out in a nitrogen atmosphere at a maximum temperature of 600° C. Note that the melting point of the eutectic solder is 779° C.

(7) Next the die-bonding section 20, substrate-side bonding pad 18 and pin-side bonding pad 19 are electroplated with gold to cover their surfaces with gold.

(8) The AlN substrate 10 is heated to approximately 400° C. and the silicon semiconductor device 1 is pushed against the surface gold layer (not shown) of the die-bonding section 20 and rubbed while nitrogen gas is blown in. The silicon and gold melt together to form a gold-silicon eutectic layer 203, and the bonding is complete.

(9) Using thin aluminum wire of 20 μm in diameter, wire bonding is carried out using ultrasonic bonding.

(10) A 30 mm-square 1 mm-thick AlN sintered plate is prepared. Molybdenum-manganese metallization is carried out on the peripheral 2 mm of one side as in the AlN ring 12 to form a sealing solder section molybdenum-manganese layer 225. Nickel is electroplated onto the surface of the molybdenum-manganese layer 225 to form a nickel layer 224. In order to improve solderability, the nickel layer 224 is electroplated with gold (not shown).

(11) A 100 μm-thick foil of gold-tin eutectic solder (gold containing 20% tin by weight) is placed between the AlN ring 12 and the AlN cap 11 and heated to approximately 300° C. in a nitrogen atmosphere to form the die-bonding section 20. At this time the gold on the surface of nickel layer 222 and nickel layer 224 melts together with the gold-tin solder and the bonding by gold-tin solder is complete.

(12) The frame 35 which had fixed the periphery of the signal line Kovar pins 13 in place is cut off, and if necessary, the signal line Kovar pins 13 are bent. The same work is done to the power-source-line Kovar pins 14.

Thus the semiconductor package of this Preferred Embodiment is completed.

Figure 4:
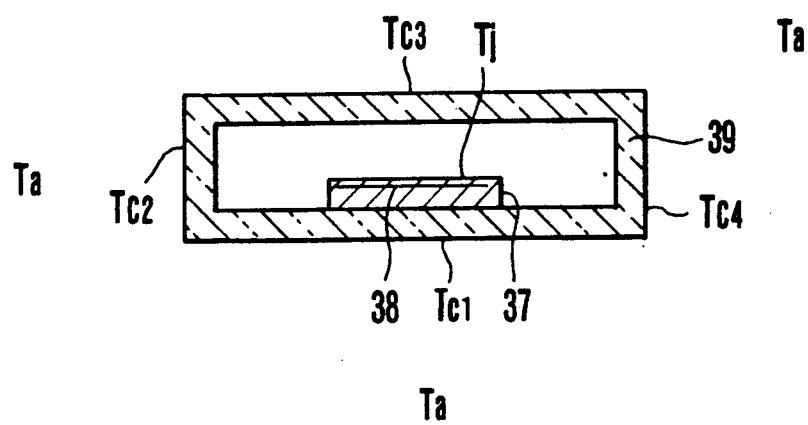
FIG. 4 and FIGS. 5a and 5b are cross-sections used to explain the semiconductor package of FIG. 2.
Figures 5A, 5B:
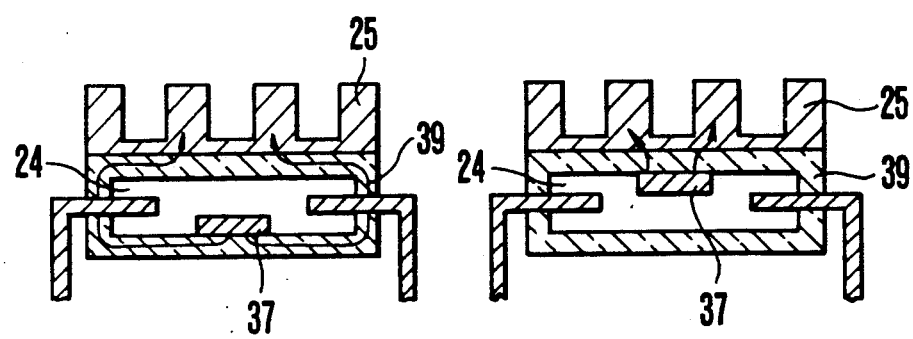

Semiconductor circuits with high computational speeds generate large amounts of heat. Therefore, a low effective thermal resistance is an essential condition for packages aiming to achieve high-speed data transmission. FIG. 4 is a cross-section of the package used to explain effective thermal resistance. A semiconductor element 37 does not generate heat from its entirety, but rather heat is generated in an extremely narrow region. For example, bipolar devices only generate heat at the p-n reverse junction (the place where current flows from the n to p sections). For this reason, the section which generates concentrated heat shall be called the junction 38. The temperature here is called $T_j$. Heat generated by the semiconductor element 37 (at the junction 38) migrates to the surface of the package 39 and raises its temperature. However, the temperature varies depending on the location. In the Figure, $T_{c1} > T_{c2}$ and $T_{c4} > T_{c3}$. Then the heat is radiated into the surroundings. This raises the temperature of the air. The temperature of air in regions to which heat does not migrate and are not heated up is called $T_a$. The effective thermal resistance is found by dividing the difference between $T_j$ and the temperature of other sections by the energy consumed by the semiconductor device. There are effective thermal resistances found from temperature differences between $T_j$ and $T_{c1}$ through $T_{c4}$ and effective thermal resistance found from the $T_j$ and $T_a$. In this invention, the effective thermal resistance found from $T_j$ and $T_a$ is called the effective thermal resistance. The AlN used in this Preferred Embodiment has a high thermal conductivity of 200 W/m·K, so one effect of this is the package of this Preferred Embodiment has a low effective thermal resistance. In addition, this Preferred Embodiment employs the cavity-below arrangement with good heat radiation as described above, so the high thermal conductivity of AlN is taken further advantage of structurally. The reason for the difference in the heat radiation properties of the cavity-below structure and the cavity-above structure will be described here. FIG. 5 compares the path of heat generated by the semiconductor device until it is dispersed into the surroundings of the package, in the cavity-above structure (FIG. 5(a)) and in the cavity-below structure (FIG. 5(b)). The flow of heat is shown by arrows. In the cavity-above structure, the flow of heat takes a long path through the package so the effective thermal resistance is large. In addition, the gas 24 within the cavity does not allow convection currents to be generated with only the volume within the package cavity, so in comparison to the solid, it virtually does not contribute to heat transfer. This also increases the effective thermal resistance. In comparison, in the cavity-below structure, heat can travel directly to the cooling fins 25 so the effective thermal resistance is suppressed to a low value.

Figure 6:
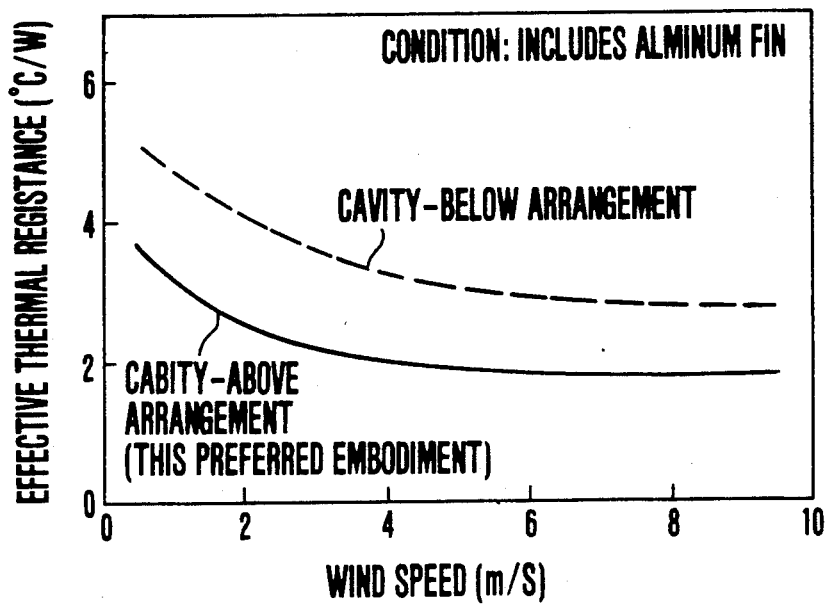
FIG. 6 is a graph of effective thermal resistance of the semiconductor package as a function of wind speed.

FIG. 6 is a chart showing effective thermal resistance data comparing the cavity-above structure and cavity-below structure. The tendency for effective thermal resistance to decrease with increasing wind speed is the same for both the cavity-above and cavity down arrangements. The effective thermal resistance is always lower for cavity-below than cavity-above, and the same effective thermal resistance was found at a wind speed of 2 m/s for cavity-below and at a wind speed of 8 m/s for cavity-above. The semiconductor device of this Preferred Embodiment has 600 bonding pads. Conventional flat packages could not fit 600 pins in a package measuring 30 mm square. But in this Preferred Embodiment, the pins are arranged in two rows, so with a pitch of 250 μm between signal line pins and 500 μm between power-source line pins, a fetch of 600 pins can be achieved relatively easily.

The semiconductor package shown in the Preferred Embodiment of FIG. 2 is mounted on a printed substrate 40. The pitch of the signal line pins 13 is small so the tips are bent and connected to copper pads 41 of a printed substrate 40 with lead-tin eutectic solder 42. In contrast, the pitch of power-source-line pins is relatively long, and their cross-sectional area is also large, so the most commonly employed typical mounting method in which pins are inserted into conductive through holes in the printed substrate can also be employed. However, in this Preferred Embodiment, to further simplify the fabrication of the printed substrate, the power-source-line pins 14 are also bonded to the surface of the printed substrate.

The signal line pins 13 have small cross-sectional areas so they cannot be expected to mechanically support the package. The weight of the package is supported solely by the power-source-line pins 14.

Figure 7:
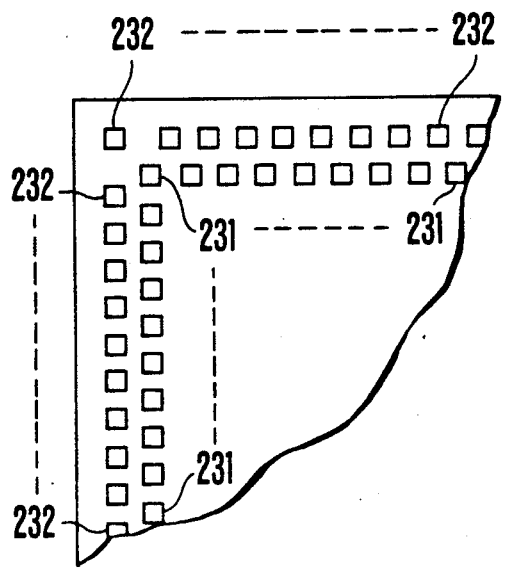
FIG. 7 is a top view of signal-line and power-supply-line terminal-side bonding pads.

FIG. 7 is a top view of bonding pads on the semiconductor device of this Preferred Embodiment. On a 15 mm square, 600 bonding pads cannot be arranged in a single row. To solve this problem, in this Preferred Embodiment, the bonding pads are arranged in two rows. In the package, a bonding pad for the power-source line, the substrate-side bonding pad 18, is arranged on the side near the semiconductor device 1 as shown in FIG. 2, so corresponding pads, power-source-line device-side bonding pads 232, are arranged on the periphery of the semiconductor device. Naturally, signal-line device-side bonding pads 231 are arranged inside these.

Embodiment 3

Figure 8:
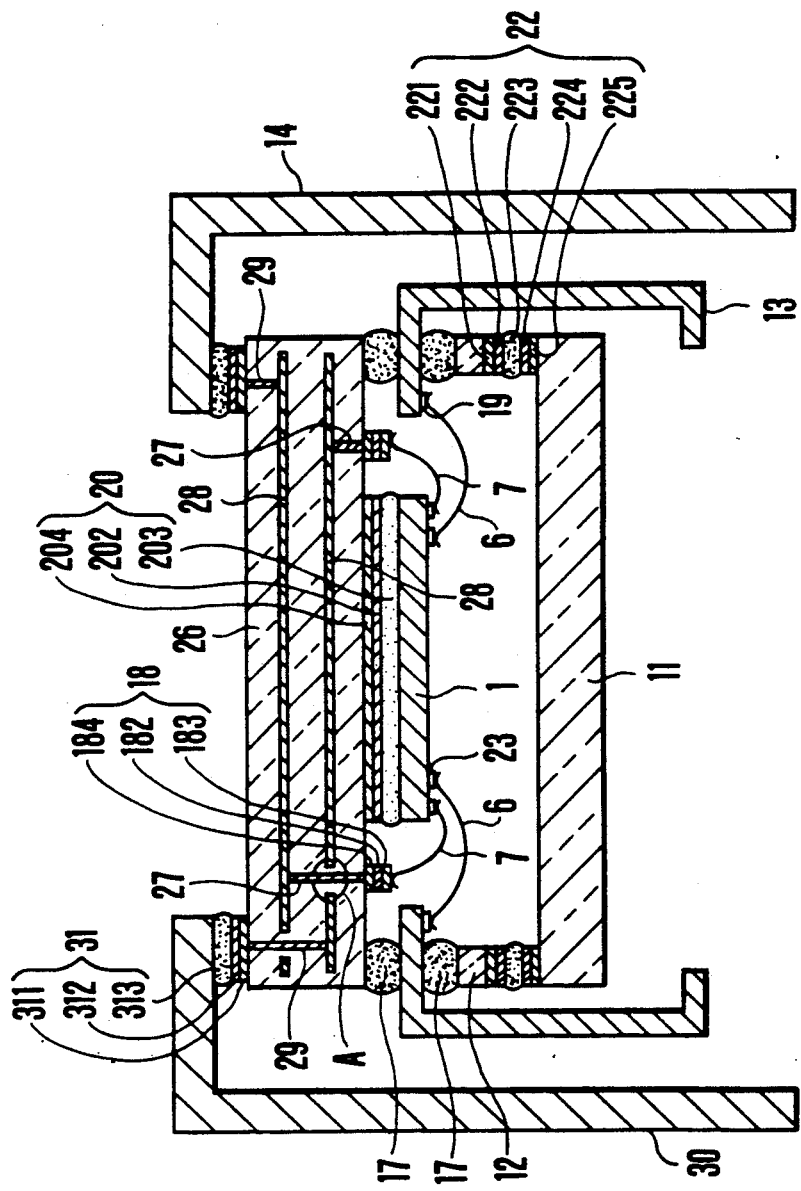
FIG. 8 is a cross-section of a semiconductor package which illustrates Preferred Embodiment 3 of the invention.

FIG. 8 is a cross-section of a semiconductor package which illustrates a third embodiment of the invention. This package has a nearly identical structure as Preferred Embodiment 1 shown in FIG. 2. Here follows an explanation of the differences and the effects of this Preferred Embodiment.

The biggest differences from Preferred Embodiment 2 are that the AlN substrate 10 is replaced by a SiC substrate 26 and that the power source pins 30 are connected to the surface of substrate 10. The SiC substrate 26 is made by mixing SiC (silicon oxide) powder and 10% or less by weight of BeO powder (other sintering assistants may also be added), and sintering the mixture at 2,100°–2,300° C. The SiC sintered body is characterized by a coefficient of thermal expansion near that of silicon, a thermal conductivity the same as that of AlN, and furthermore a dielectric constant of 40–100 or approximately ten times greater than that of AlN. Thus the capacitance of the planar conductive layers 28 is large at approximately 1500 pF so the smoothing effect of the power source voltage is large. Note that AlN has a coefficient of thermal expansion nearly equal to that of SiC, and its machinability is excellent, so it was used for the AlN cap 11 and AlN ring 12.

Structurally, the differences are as follows:

(1) The path of the power source current is not through the an end face of the SiC substrate but through the surface outside the periphery of the package. This results in the addition of linear conducting paths 29. The effect of this change is that the number of bends in the power-source-line Kovar pins 30 are reduced, improving the reliability of the pins. In Preferred Embodiment 2 the power-source-line Kovar pins 14 are bent twice at the Kovar pin bonding sections 21 so they were subject to external forces and susceptible to breaking. But this structure has the drawback of a smaller area of contact with the cooling fins. For this reason, the Kovar pin bonding sections 31 are arranged along the periphery of the SiC substrate 26.

(2) The tips of the power-source-line Kovar pins 30 are made straight in a form which can be directly inserted into the printed substrate. This results in a total number of bends of the power-source-line Kovar pins 30 being 1, improving the reliability of the pins. Furthermore, the reliability of the connection with the printed substrate is higher than the surface connection of Preferred Embodiment 1.

Figure 9:
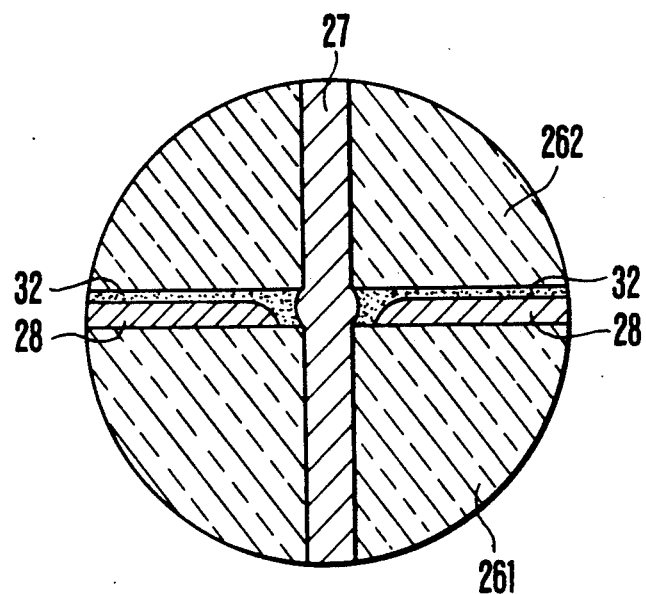
FIG. 9 is an enlargement of section A of the substrate of the semiconductor package of FIG. 8.

Here follows a description of changes in the fine structure due to the use of a SiC substrate. SiC is different than AlN in that tungsten wiring cannot be formed simultaneously with sintering. To solve this difficulty, wiring is created by molybdenum-manganese metallization of a previously sintered SiC substrate as described above. FIG. 8 omits the fine detail of the SiC substrate, but FIG. 9 is an enlargement of section "A" of FIG. 8 showing this detail. Linear conducting paths 27 are formed by filling in holes punched in the lower-level SiC substrate 261, and at the same time molybdenum-manganese metallization layers are formed on the surface of the linear conducting paths 27 so that the surface of linear conducting paths 27 protrudes from the surface of the lower-level SiC substrate 261. An upper-level SiC substrate 262 within which linear conducting paths 29 are similarly formed by filling in existing holes is placed on top of the lower-level SiC substrate 261. The adhesive used at this time is the same glass used in Preferred Embodiment 1. After adhesion, an extremely thin glass layer 32 remains. This layer has a small dielectric constant, but its thermal conductivity is also small so it directly affects performance, so it is vital that the layer be made as thin as possible.

As described above, the fine structure is different from Preferred Embodiment 1, but the basic structure as an electrically insulating substrate and its fundamental effects are unchanged from Preferred Embodiment 1.

Embodiment 4

Figure 10:
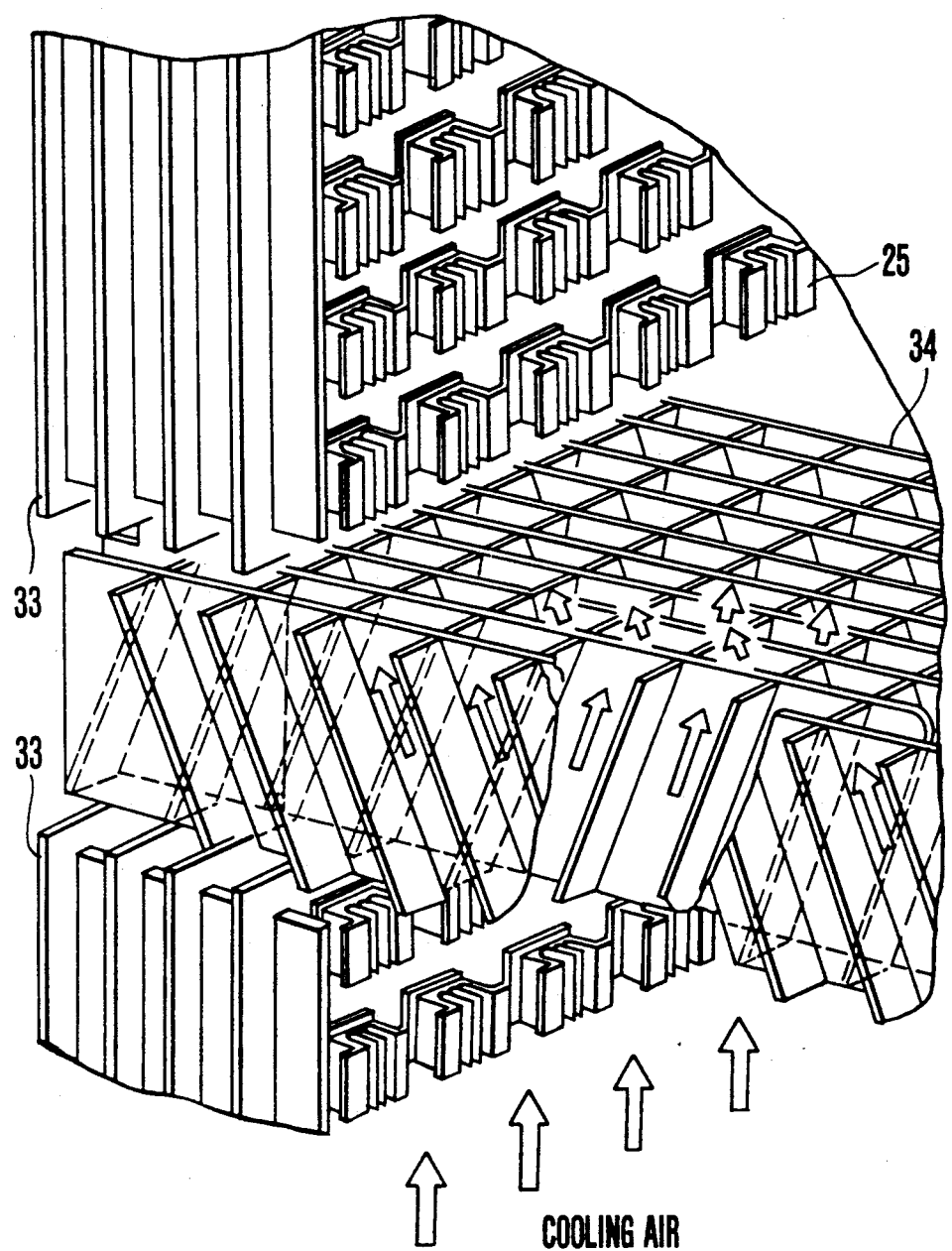
FIG. 10 illustrates Preferred Embodiment 4 of the semiconductor package of the invention.

FIG. 10 illustrates a fourth embodiment of the semiconductor package of the invention. FIG. 10 is a perspective view of the semiconductor package of the invention mounted in a supercomputer. The semiconductor packages illustrated in Preferred Embodiments 1 and 2 are three-dimensionally mounted on multi-layer printed substrates 33 connected to platters with connecters. In this Preferred Embodiment, these have a structure divided into an upper platter and a lower platter. Cooling air is blown from below through a cross-flow grid 34 provided between the two platters as a means of eliminating any unevenness in temperature distribution due to cooling.

Semiconductor packages including logic packages, VR (vector register) packages, main memory packages, expanded memory packages are used and mounted on the highly integrated logic platters.

Used as logic packages are logic LSIs and RAM modules; as VR packages are logic LSIs and VR LSIs; as main memory are DRAM (dynamic random access memory) and the like. These packages are mounted on the printed substrates by surface mounting, axial mounting, both-side mounting and the like. By means of this Preferred Embodiment, the fastest supercomputers can be obtained.

Embodiment 5

Figure 11A:
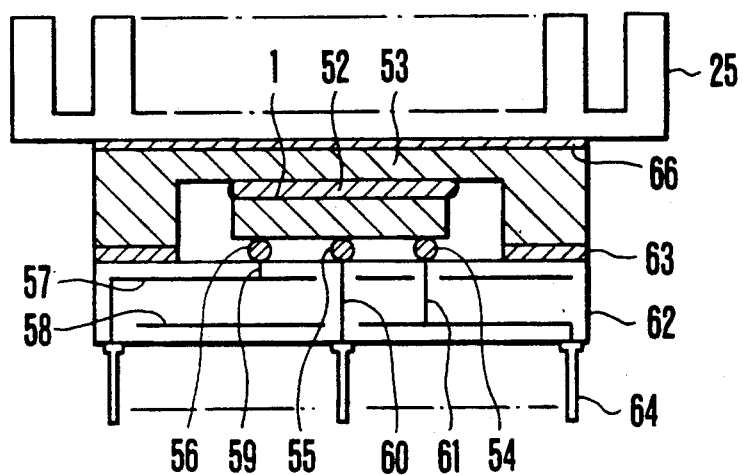
FIG. 11(a) is a cross-section of a semiconductor package which illustrates Preferred Embodiment 5 of the invention.
Figure 11B:
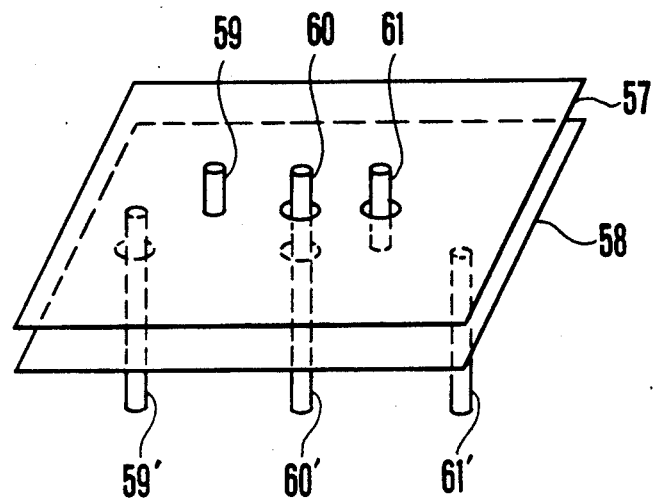
FIG. 11(b) is a schematic diagram illustrating wiring paths.

FIG. 11(a) is a cross-section illustrating a fifth embodiment of the invention. FIG. 11(b) is a schematic diagram illustrating the connections of parallel conductive layers within a ceramic insulating base substrate 62 used in Preferred Embodiment 5 of the invention. The semiconductor device 1 is bonded to an insulating cap substrate 53 by filling material 52 with a good thermal conductivity. The insulating base substrate 62 and insulating cap substrate 53 are sintered bodies of aluminum nitride (AlN). The coefficient of thermal expansion of aluminum nitride is $3.4 \times 10^{-6}/°C.$, near the coefficient of thermal expansion of silicon which is the material for the semiconductor device, so the reliability of the connection to the semiconductor device 1 is sufficiently high. Furthermore, the thermal conductivity of aluminum nitride is relatively high at 150 W/m·K so heat generated from the semiconductor device 1 can be sufficiently passed on to the cooling fins 25 made of Al, Cu or other metals. Note that while aluminum nitride is used here for the insulating cap substrate 53, high-thermal-conductivity silicon carbide (SiC) containing up to 10% beryllium by weight may also be used. The coefficient of thermal expansion of this high-thermal-conductivity silicon carbide (SiC) is $3.7 \times 10^{-6}/°C.$, near the coefficient of thermal expansion of silicon which is the material for the semiconductor device, so the reliability of the connection to the semiconductor device 1 is sufficiently high and furthermore, its thermal conductivity is high at 270 W/m·K so the effective thermal resistance of the package can be reduced. A material other than the above may also be used as long as its coefficient of thermal expansion is close to that of silicon and it is an insulating material of a sufficiently high thermal conductivity. The semiconductor device 1 and insulating base substrate 62 maintain electrical connections 54, 55 and 56 which are soldered using the method of controlled collapse bonding (CCB). The insulating base substrate 62 is formed by providing holes in a green sheet of aluminum nitride (AlN), packing the holes with tungsten paste, laminating a plurality of green sheets printed with wiring patterns on their surface and simultaneously sintering the laminate. Terminal pins for external connection 64 made of Kovar are then fixed by soldering or the like. A material other than the aluminum nitride described above may also be used as long as it is a material like alumina ($Al_2O_3$), mullite, epoxy glass, or polyimide glass, in that conductors may be formed within the material.

Considering the reliability of the hermetic seal of the package, the coefficients of thermal expansion of the insulating base substrate 62 and insulating cap substrate 53 are preferably equal. The combination of materials listed above with the highest reliability of the hermetic seal of the package would be to use the same material for the insulating base substrate 62 and the insulating cap substrate 53, and a package using aluminum nitride (AlN) is particularly preferable. In order to maintain the hermetic seal of the package, the insulating base substrate 62 containing conductive layers 57–61 is bonded and sealed to the insulating cap substrate 53 with a package-sealing layer 63 around its periphery.

Figure 12:
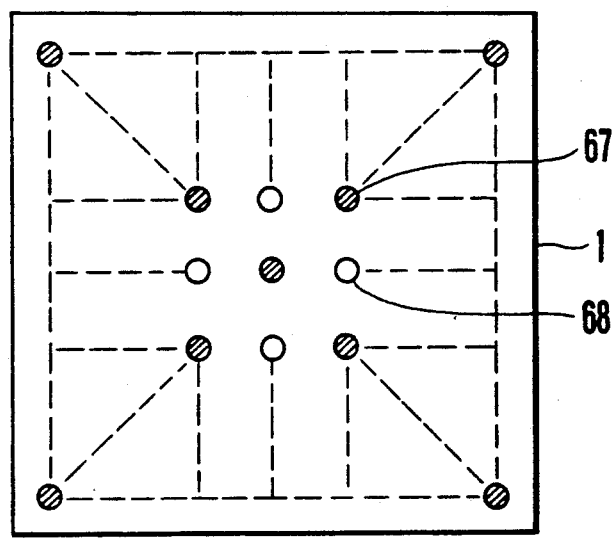
FIG. 12 is a top view illustrating the electrode formation pattern of the semiconductor devices of FIG. 11(a).

The electrical connections are as follows. Semiconductor device 1 is connected to an electrode (not shown) on top of insulating base substrate 62 by means of the CCB method using solder bumps. One main surface of the electrode of the semiconductor device 1 is shown in FIG. 12. Power supply or ground connection electrodes 68, shown as white circles, are regularly arranged alternating with the black circles of signal-transmission electrodes 67. The dotted lines in the Figure represent electrodes which have been omitted. As shown in FIG. 11(b), the signal-transmission conductive layer runs along a conductive layer 60 which extends from directly below solder bump 55, through holes provided in extended conductive solid layers 57 and 58 and connects to the terminal pins for external connection 64 without contacting the extended conductive solid layers 57 and 58. Since the conductive layer 60 within an insulating base substrate 62 connects the front and rear of the substrate by the shortest distance, even if a ceramic with a large dielectric constant is used for the substrate, the propagation delay time is made as short as possible. The power-supply conductive layer runs from solder bump 56 along conductive layer 59 and connects to the power-supply extended conductive solid layer 57 provided within insulating base substrate 62. The power-supply conductive layer then runs from the periphery of power-supply extended conductive solid layer 57 through conductive layer 59' provided perpendicularly to insulating base substrate 62 and, without contacting extended conductive solid layer 58, connects to the terminal pins for external connection 64 provided on the periphery of the package. The ground-connection conductive layer runs from solder bump 54 through conductive layer 61 and, without contacting extended conductive solid layer 57, connects to ground-contact extended conductive solid layer 58. The ground-connection conductive layer then runs from the periphery of ground-connection extended conductive solid layer 58 through conductive layer 61' provided perpendicularly to insulating base substrate 62 and connects to terminal pins for external connection 64 provided on the periphery of the package. In the Figure, two wiring extended layers are provided, but if necessary, more than two layers can also be provided. The extended conductive solid layers 57 and 58 serve to increase the capacitance between the ground-connection and power-supply conductive layers. In effect a capacitor device is formed within the highly dielectric insulating base substrate 62, so not only can sudden voltage fluctuations be reduced, but the wiring length can be shortened in comparison to an externally-mounted capacitor. This allows the quality of the transmitted waveform to be improved and the transmission time reduced.

In a package of this construction, heat generated by the semiconductor device 1 is passed to the aluminum nitride insulating cap substrate 53 through the filling material 52 of good thermal conductivity. Heat within the insulating cap substrate 53 will disperse and pass to the cooling fins 25 and be radiated. Since the path of heat transfer is short, this structure is suited for mounting bipolar ECL chips and other chips which consume large amounts of power. The material for the terminal pins for external connection 64 is Kovar (Fe-29 Ni-17 Co). The coefficient of thermal expansion of Kovar is $4.5 \times 10^{-6}/°C.$, near to that of aluminum nitride. Therefore, the structural materials all have coefficients of thermal expansion near to that of silicon, so the problem of thermal fatigue due to differences in coefficients of thermal expansion between members will not occur for any part within the package.

Mullite sintered bodies in which the ratio of $Al_2O_3$ to $SiO_2$ is between 50:50 and 80:20 have room-temperature thermal conductivities of 3.7 to $4.5 \times 10^{-6}/°C.$, near that of Si, and since the dielectric constant at 1 MHz is approximately 7, they would be particularly effective as caps and base boards in this invention. Mullite sintered bodies are crystalline bodies of the formula $3Al_2O_3 \cdot 2SiO_2$, and these crystalline bodies are within the above range of compositions.

Embodiment 6

Figure 13:
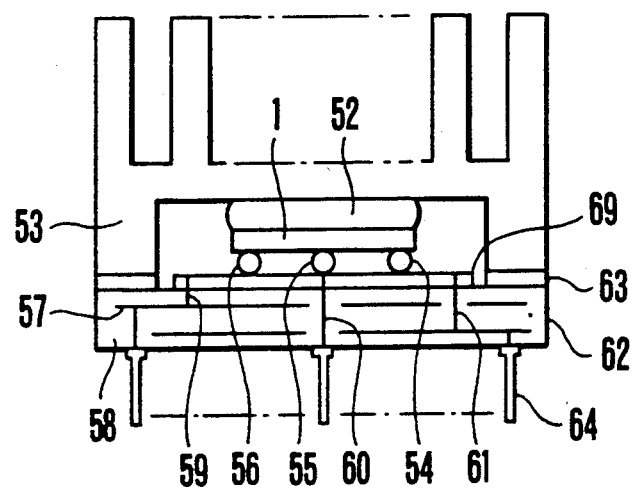
FIG. 13 is a cross-section of a semiconductor package which illustrates Preferred Embodiment 6 of the invention.

FIG. 13 is a cross-section illustrating a sixth embodiment of the invention. The main difference between the structure of Preferred Embodiment 6 and Preferred Embodiment 5 is that a wiring extension layer 69 is provided between the semiconductor device 1 and the insulating base substrate 62. The wiring extension layer 69 has the following structure. A film of polyimide or other resin is formed on insulating base substrate 62 made from aluminum nitride. On this resin film, aluminum lines are used to connect an electrode section connected to the electrodes of semiconductor device 1 to an wiring-end electrode section connected to electrodes on the insulating base substrate 62. By using aluminum as the wiring material, electrical resistance is small. The wiring material need not be aluminum, as long as it is copper or another high-conductivity metal. Next, a resin film is formed on areas other than the electrode sections, and a vapor deposition layer of titanium (Ti) - platinum (Pt) - gold (Au) is formed on the electrode sections. Since the wiring extension layer of this Preferred Embodiment is formed on the above resin layer which has a dielectric constant of 3 to 4 at 1 MHz, the propagation lag time is small. Even without the above structure, as long as the insulating base substrate is sufficiently smooth, the vapor deposition layer of titanium (Ti) - platinum (Pt) - gold (Au) may be formed directly on top of the substrate as wiring. Even if the wiring pattern design would need to be changed, only the above wiring pattern need be changed so there is no need to change the insulating base substrate 62. Thus wiring pattern changes can be simply carried out. In addition, if there are a large number of signal transmission electrodes and there is insufficient space within the insulating base substrate which extends directly below the solder bumps, the wiring extension layer 69 can be used to extend the wiring to any desired location.

In a package with this structure, heat generated by the semiconductor device 1 is passed to the aluminum nitride insulating cap substrate 53 through the filling material 52 of good thermal conductivity. This insulating cap substrate 53 is fabricated from a high-thermal-conductivity aluminum nitride sintered body and is machined as a unit with the cooling fins. Heat within the insulating cap substrate 53 will disperse and pass to the cooling fins 65 and be radiated. Since the path of heat transfer is short, this structure is suited for mounting bipolar ECL chips and other chips which consume large amounts of power.

Embodiment 7

Figure 14:
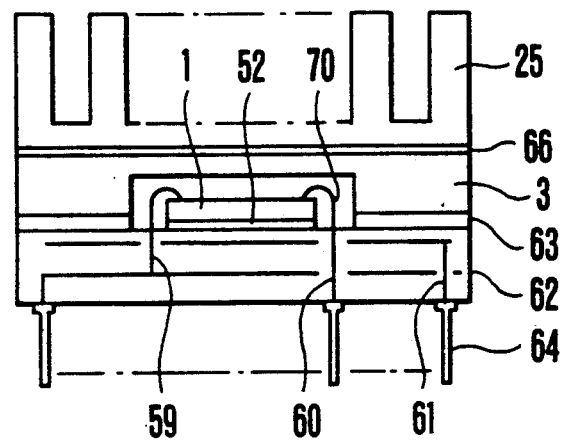
FIG. 14 is a cross-section of a semiconductor package which illustrates Preferred Embodiment 7 of the invention.

FIG. 14 is a cross-section illustrating a seventh embodiment of the invention. The semiconductor device 1 is bonded to the insulating base substrate 62 made from an aluminum nitride sintered body. The electrodes of the semiconductor device 1 are connected to the electrodes of insulating base substrate 62 with wire bonding 70 made from fine wire of Au, Cu, Al or other metal. In order make the wiring length within the insulating base substrate 62 as short as possible, a signal-transmission conductive layer 60 provided perpendicularly within the substrate is connected to signal-transmission terminal pins for external connection 64 provided in the periphery below the semiconductor device 1. Power-supply conductive layer 59 and ground-connection conductive layer 61 are connected through extended solid layers to terminal pins for external connection 64 located on the periphery of insulating base substrate 62. Even in packages which are not required to have superior heat radiation properties, being mounted with semiconductor devices which operate at low levels of power consumption, the propagation lag time can be made as short as possible, and the capacitor device formed within the insulating base substrate near the semiconductor device 1 is able to reduce sudden voltage fluctuations. This allows the quality of the transmitted waveform to be improved and the transmission time reduced. This point is the same as in Preferred Embodiment 4.

Embodiment 8

Figure 15:
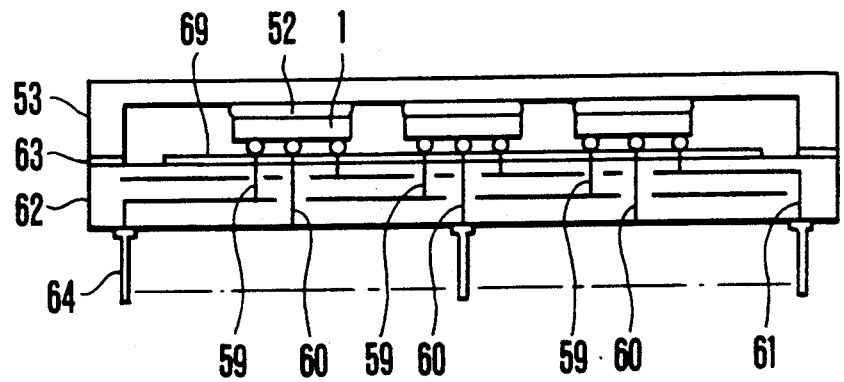
FIG. 15 is a cross-section of a semiconductor package which illustrates Preferred Embodiment 8 of the invention.

FIG. 15 is a cross-section illustrating an eight embodiment of the invention. A plurality of semiconductor devices 1 are mounted by CCB on a insulating base substrate 62 provided with a wiring extension layer 69. Depending on the application, the semiconductor devices can be increased in number or exchanged.

The material for the insulating base substrate 62 and insulating cap substrate 53 is an aluminum nitride (AlN) sintered body.

The wiring extension layer 69 has the same structure as in Preferred Embodiment 3. When multiple chips are contained in a single package as in this Preferred Embodiment, signals can be exchanged through wiring even between chips, so the wiring patterns become complex. Even if the wiring pattern design would need to be changed, only the above wiring pattern need be changed so there is no need to change insulating base substrate 62 or insulating cap substrate 53. Thus wiring pattern changes can be simply carried out. The wiring extension layer 69 also connects semiconductor devices, so the propagation time lag can be reduced in comparison with the connection of packages mounted with single semiconductor devices.

The signal-transmission conductive layer 60 passes through a conductive layer within the insulating base substrate 62 formed perpendicularly to the substrate, and connects to the pin-shaped external connection terminals 64. Since the conductive layer within the insulating base substrate 62 connects the front and rear of the substrate by the shortest distance, even if a ceramic with a large dielectric constant is used for the substrate, the propagation delay time is made as short as possible.

Since the insulating base substrate 62 and insulating cap substrate 53 are made of the same material the hermetic seal of the package is excellent.

In this Preferred Embodiment, cooling fins are not shown, but cooling fins may be provided. In a In a package with this structure, heat generated by the semiconductor device 1 is passed to the aluminum nitride insulating cap substrate 53 through the filling material 52 of good thermal conductivity. Heat within the insulating cap substrate 53 will disperse. Since the path of heat transfer is short, semiconductor devices which generate small amounts of heat can be mounted within the same package as semiconductor devices which generate large amounts of heat, so computational processing speed can be higher than that of combinations of packages each containing a single semiconductor device.

Furthermore, a part of a power-source layer 59 is formed within the substrate as a planar film as shown in FIG. 1(b), so in aluminum nitride or silicon dioxide which have high dielectric constants, it acts as a capacitor to eliminate malfunctions due to voltage fluctuations.

Embodiment 9

Figure 16:
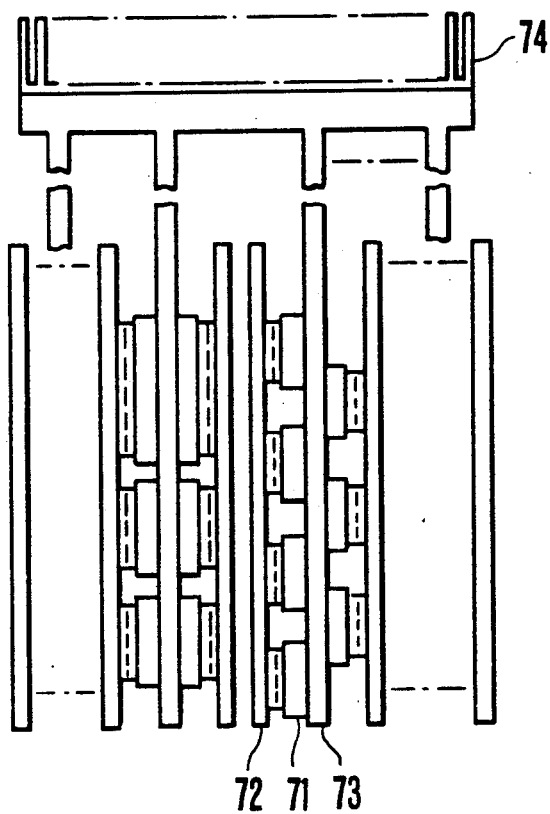
FIG. 16 illustrates Preferred Embodiment 9 in which the semiconductor package of the invention in FIG. 13 is mounted in a computer.

FIG. 16 is a schematic of the semiconductor package of the invention mounted in a supercomputer. A semiconductor package 71 shown in FIGS. 2 through 5 is mounted on multi-layer printed substrate and connected to the platters with connectors. One main surface of the semiconductor package is connected to a heat pipe 73, so that heat is carried by this heat pipe to a heat exchanger 74 and dissipated.

Semiconductor packages including logic packages, VR (vector register) packages, main memory packages, expanded memory packages are used and mounted on the highly integrated logic platters.

Used as logic packages are logic LSIs and RAM modules; as VR packages are logic LSIs and VR LSIs; as main memory are MS (main storage) modules; and as auxiliary memory are DRAM (dynamic random access memory) and the like. These packages are mounted on the printed substrates by surface mounting, axial mounting, both-side mounting and the like. By means of this Preferred Embodiment, the fastest supercomputers can be obtained.

What is claimed is:

1. A semiconductor package comprising:
an electrically insulating substrate on which a semiconductor device is mounted;
an electrically insulating cap which excludes outside air and seals said semiconductor device;
power-source lines which provide a power source for said semiconductor device; and
signal lines which transmit signals from said semiconductor device;
an improvement in which said power-source lines are formed within said electrically insulating substrate in parallel with the surface on which said semiconductor device is mounted, and in which said signal lines are arranged perpendicular to said surface of said electrically insulating substrate.

2. A semiconductor package comprising:
an electrically insulating substrate on which a semiconductor device is mounted,
an electrically insulating cap which excludes outside air and seals said semiconductor device,
power-source lines which provide a power source for said semiconductor device, and
signal lines which transmit signals from said semiconductor device,
an improvement in which said power-source lines pass through the interior of said electrically insulating substrate to connect to external leads, and
said signal lines pass through the interior of either said electrically insulating substrate or said electrically insulating cap to connect to external leads;
said signal lines extending in a direction perpendicular to a major surface of the substrate.

3. A semiconductor package comprising:
an electrically insulating substrate on which a semiconductor device is mounted,
an electrically insulating cap which excludes outside air and seals said semiconductor device,
power-source lines which provide a power source for said semiconductor device, and
signal lines which transmit signals from said semiconductor device,
an improvement in which said power-source lines electrically connect a conductive layer within said electrically insulating substrate to said semiconductor device with fine metal lines on a surface on which said semiconductor is mounted, said conductive layer and said external leads on said semiconductor package are electrically connected on a side face of said electrically insulating substrate, and
said signal lines are connected to said semiconductor device and external leads by fine metal lines; said signal lines extending in a direction perpendicular to a major surface of the substrate.

4. A semiconductor package comprising:
an electrically insulating substrate on which a semiconductor device is mounted,
an electrically insulating cap which excludes outside air and seals said semiconductor device,
power-source lines which provide a power source for said semiconductor device, and
signal lines which transmit signals from said semiconductor device,
an improvement in which said power-source lines comprise a conductive layer provided within said electrically insulating substrate,
said signal lines are arranged to minimize the contact of said signal lines with said substrate having a dielectric constant,
said conductive layer and said semiconductor device are electrically connected by fine metal lines on said surface of said electrically insulating substrate on which said semiconductor device is mounted, said conductive layer is electrically connected to external leads of said semiconductor package by the conductive layer extending to the periphery of said electrically insulating substrate and connected to the external leads on a lateral face of said substrate, and the surface of said semiconductor device onto which no circuits are formed is directly bonded by metal to said electrically insulating substrate; said signal lines extending in a direction perpendicular to with a major surface of the substrate.

5. A semiconductor package comprising:

an electrically insulating substrate made of a ceramic sintered body on which a semiconductor device is mounted, an electrically insulated cap made of ceramic sintered body which excludes outside air and seals said semiconductor device, power-source lines which provide a power source for said semiconductor device, and signal lines which transmit signals from said semiconductor device, an improvement in which said signal lines are arranged to minimize the contact of said signal lines with said substrate having a dielectric constant and said signal lines extend in a direction perpendicular to a major surface of the substrate, said electrically insulating substrate and said electrically insulating cap have coefficients of thermal expansion which approximate that of silicon, and at least said electrically insulating substrate has a coefficient of thermal expansion greater than 100 W/m·K and a dielectric constant of 8.8 or more.

6. A semiconductor package comprising:

an electrically insulating substrate to which a semiconductor device is mounted, an electrically insulating cap which excludes outside air and seals said semiconductor device, power-source lines which provide a power source for said semiconductor device, and signal lines which transmit signals from said semiconductor device, an improvement in which said power-supply lines are formed from a conductive layer provided within said substrate, said signal lines are arranged to minimize the contact of said signal lines with said substrate having a dielectric constant, said electrically insulating substrate and said electrically insulating cap are bonded and sealed with glass, external connection terminals for said power-supply lines and signal lines are a plurality of metal pins provided on a side of said substrate and cap, tips of said metal pins are positioned on the electrically insulating cap-side of said semiconductor package and said power-supply lines and signal lines are divided into separate rows, the tips of signal-line external lead metal pins connected to an electrical connection circuit without passing through either said electrically insulating substrate or said electrically insulating cap are in contact with the surface of a conductive pad on a printed substrate and are electrically connected to the printed substrate by soldering, the tips of said power-source external lead metal pins connected to an electrical connection circuit which passes through said conductive layer within said electrically insulating substrate member are in contact with and soldered to the surface of a conductive pad on a printed substrate, or are inserted into holes formed on the printed substrate, and thus electrically connected to the printed substrate, said power-source line metal pins are thicker than, and spaced further apart than, said signal-line metal pins, so they act to mechanically support said semiconductor package.

7. A semiconductor package provided with an electrically insulating substrate on which a semiconductor is mounted, an electrically insulating cap which excludes outside air and seals said semiconductor device, power-source lines which provide a power source for said semiconductor device, and signal lines which transmit signals from said semiconductor device, an improvement in which, in order to minimize the contact of said signal lines with said substrate having a dielectric constant, said signal lines are wired to extend perpendicularly to a major surface of the substrate within said substrate, and said power-source lines penetrate through a conductive layer formed within said substrate parallel to a surface on which said semiconductor device is mounted, and connects to external leads.

8. A semiconductor package comprising:

an electrically insulating substrate on which a semiconductor device is mounted, an electrically insulating cap which excludes outside air and seals said semiconductor device, power-source lines which provide a power source for said semiconductor device, and signal lines which transmit signals from said semiconductor device, an improvement in which said power-source lines are connected through conductive layers formed within said substrate to external leads, said conductive layers are longer than the thickness of the substrate and have sufficient length that malfunctions accompanying external voltage fluctuations do not occur, said signal lines are formed of conductive paths within said substrate and are of a length equal to the thickness of said substrate, and external terminals for said power-supply lines and signal lines are formed on a backside of the substrate on an opposite side from the surface on which said semiconductor device is mounted; said signal lines extending in a direction perpendicular to a major surface of the substrate.

9. A semiconductor package comprising:

an electrically insulating substrate on which a semiconductor device is mounted, an electrically insulating cap which excludes outside air and seals said semiconductor device, power-source lines which provide a power source for said semiconductor device, and signal lines which transmit signals from said semiconductor device;

an improvement in which said signal lines are arranged to minimize the contact of said signal lines with said substrate having a dielectric constant, terminals for the power-source lines formed on said substrate are arranged outside of the terminals for said signal lines, said semiconductor device is connected to external connection terminals formed on said substrate by solder bumps, electrodes for the power source of said semiconductor device or for connecting to ground are in a plurality of rows, alternating with electrodes for signal lines, and the surface opposite the surface on which the electrodes of said semiconductor device are provided is connected to an electrically insulating cap by a resin containing material with high thermal conductivity; said signal lines being arranged to extend in a direction perpendicular to a major surface of the substrate.

10. A semiconductor package comprising:
an electrically insulating substrate made of a ceramic sintered body on which a semiconductor device is mounted;
an electrically insulating cap made of a ceramic sintered body which excludes outside air and seals said semiconductor device,
power-source lines which provide a power source for said semiconductor device; and
signal lines which transmit signals from said semiconductor device;
an improvement in which said signal lines are arranged to minimize the contact of said signal lines with said substrate having a dielectric constant,
said electrically insulating substrate and said electrically insulating cap have coefficients of thermal expansion which approximate that of silicon;
at least said electrically insulating substrate has a coefficient of thermal expansion greater than 100 W/m·K and a dielectric constant of 8.8 or more; and
a thin-film multi-layer wiring layer made of resin is formed on the surface on which said semiconductor device is mounted, and then the semiconductor device is mounted on this wiring layer; said signal lines being arranged to extend a direction in perpendicular to a major surface of the substrate.

11. A semiconductor package comprising: an electrically insulating substrate on which a semiconductor device is mounted,
an electrically insulating cap which excludes outside air and seals said semiconductor device;
power-source lines which provide a power source for said semiconductor device; and
signal lines which transmit signals from said semiconductor device,
an improvement in which, in order to minimize any effects of a dielectric constant of the substrate, said signal lines are wired to extend perpendicularly to a major surface of the substrate within said substrate;
said power-source lines penetrate through a conductive layer formed within said substrate parallel to a surface on which said semiconductor device is mounted and connects to external leads; and
said signal lines and power-source lines are connected to the electrodes for said semiconductor device with fine metal lines.

12. A semiconductor package of any of claims 7 through 11 in which the external leads for signal lines and external leads for power-source lines on said electrically insulating substrate are carried out by I/O pins formed perpendicularly to said substrate.

13. A semiconductor package which comprises:
an electrically insulating substrate comprising a plurality of power and ground lines each being electrically insulated through an insulator from each other;
an electrically insulating cap, disposed on said substrate, for forming a hollow portion therein; and
a semiconductor chip mounted on the substrate within the hollow portion; wherein terminals for the power and ground lines are electrically connected to the power and ground lines in such a manner that one of the terminals is connected to one power and ground lines arranged in a plane but is not connected to another power and ground line arranged in a plane, and a signal line penetrates the substrate and is separated from the power and ground lines; said signal line extending perpendicular to a major surface of said substrate.

* * * * *